United States Patent
Riedel et al.

(10) Patent No.: US 9,668,376 B2
(45) Date of Patent: May 30, 2017

(54) ELECTRIC CONVERTER WITH COMPACT MODULE ARRANGEMENT FOR SUBSEA APPLICATIONS

(71) Applicant: ABB Schweiz AG, Baden (CH)

(72) Inventors: Gernot Riedel, Baden-Rütihof (CH); Slavo Kicin, Zürich (CH); Thomas Gradinger, Aarau Rohr (CH)

(73) Assignee: ABB Schweiz AG, Baden (CH)

( * ) Notice: Subject to any disclaimer, the term of this patent is extended or adjusted under 35 U.S.C. 154(b) by 0 days.

(21) Appl. No.: 14/903,013

(22) PCT Filed: Jul. 2, 2014

(86) PCT No.: PCT/EP2014/064045
§ 371 (c)(1),
(2) Date: Jan. 5, 2016

(87) PCT Pub. No.: WO2015/003967
PCT Pub. Date: Jan. 15, 2015

(65) Prior Publication Data
US 2016/0192540 A1   Jun. 30, 2016

(30) Foreign Application Priority Data

Jul. 9, 2013  (EP) ..................................... 13175788

(51) Int. Cl.
*H05K 7/20* (2006.01)
*H02M 7/00* (2006.01)
*H05K 7/14* (2006.01)

(52) U.S. Cl.
CPC ........ *H05K 7/20263* (2013.01); *H02M 7/003* (2013.01); *H05K 7/1432* (2013.01); *H05K 7/20927* (2013.01)

(58) Field of Classification Search
None
See application file for complete search history.

(56) References Cited

U.S. PATENT DOCUMENTS

| 6,259,616 B1 | 7/2001 | Ekwall et al. |
| 9,042,112 B2 * | 5/2015 | Guan .................. H05K 7/1432 361/676 |

(Continued)

FOREIGN PATENT DOCUMENTS

| DE | 102011006988 A1 | 10/2012 |
| EP | 2291065 A2 | 3/2011 |

(Continued)

OTHER PUBLICATIONS

Glen Wernecke, et al., "Fraunhoter-Verbund Mikroelektronik: The power grid of the future will minimize energy losses", Jan. 17, 2011, Retrieved from the Internet: URL:http://www.mikroelektronik. fraunhofer. de/en/press-media/microelectronics-news/ar ticle/das-stromnetz-der-zukunft-minimiert-energieverluste.html.

(Continued)

*Primary Examiner* — Courtney Smith
(74) *Attorney, Agent, or Firm* — Whitmyer IP Group LLC

(57) ABSTRACT

An electric converter system, including a housing configured to receive a dielectric fluid, at least two electric modules, each including a first space and a second space, the first space including a connecting portion and a cooling system configured to circulate the dielectric fluid to cool the electric modules. The converter system further includes an inter module bus bar portion including a complementary connecting portion, whereby the connecting portion is configured to be connected to the complementary connecting portion of the inter module bus bar portion, whereby the inter module bus bar portion is configured to interconnect one of the at least two electric modules with the other of the at least two electric modules, said one electric module being proximate to said other electric module, and whereby the connecting portion, the first space and the second space of each electric module are arranged in series.

13 Claims, 3 Drawing Sheets

(56) References Cited

U.S. PATENT DOCUMENTS

| | | | | | |
|---|---|---|---|---|---|
| 2007/0273335 | A1* | 11/2007 | Duff, Jr. | ............... | H01G 9/155 320/166 |
| 2011/0075451 | A1* | 3/2011 | Bayerer | ............... | H01L 24/06 363/37 |
| 2011/0134609 | A1* | 6/2011 | Folts | ............... | H01L 23/4006 361/717 |
| 2011/0316493 | A1* | 12/2011 | Thorvaldsson | ............ | H02J 3/18 323/210 |
| 2013/0194840 | A1* | 8/2013 | Huselstein | ............ | H02M 1/32 363/50 |
| 2014/0049990 | A1* | 2/2014 | Limpaecher | ............ | H02M 3/24 363/15 |

FOREIGN PATENT DOCUMENTS

| | | |
|---|---|---|
| EP | 2291067 A1 | 3/2011 |
| EP | 2487326 A1 | 8/2012 |
| EP | 2825009 A1 | 1/2015 |
| GB | 1416561 A | 12/1975 |
| WO | 2008055515 A1 | 5/2008 |
| WO | 2012093942 A1 | 7/2012 |
| WO | 2013050315 A1 | 4/2013 |

OTHER PUBLICATIONS

European Search Report Application No. EP 13175788.2 Completed: Dec. 4, 2013;Mailing Date: Dec. 11, 2013 5 pages.
International Search Report and Written Opinion of the International Searching Authority Application No. PCT/EP2014/064045 Completed: Sep. 5, 2014;Mailing Date: Sep. 16, 2014 10 pages.
IDK Components, The Customer Magazine, "The future belongs to low-loss high-voltage DC transmission (HVDC)", Apr. 30, 2012, Edition 2013, Retrieved from the Internet: URL:http://www.epcos.com/web/generator/Web /Sections/Components/Applications/2012/ 01Power capacitors for HVDC/Power capac ,tors for HVDC,templateid=renderPDF,loca le=en:Pdf -.

* cited by examiner

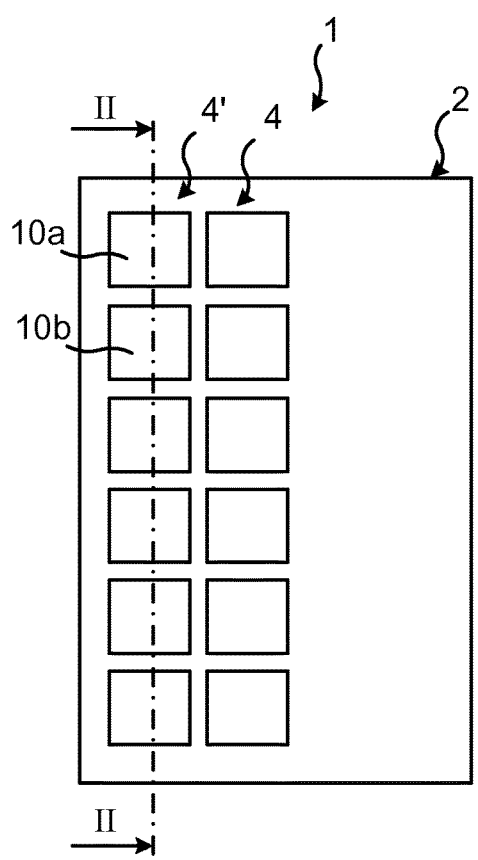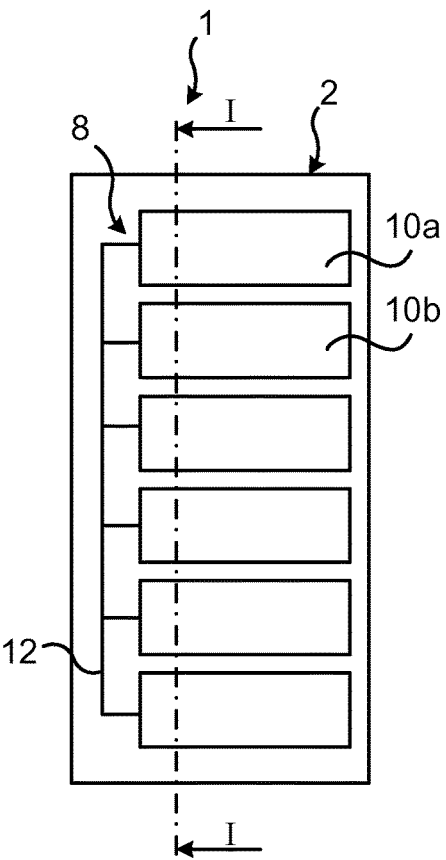
Fig. 1　　　　Fig. 2
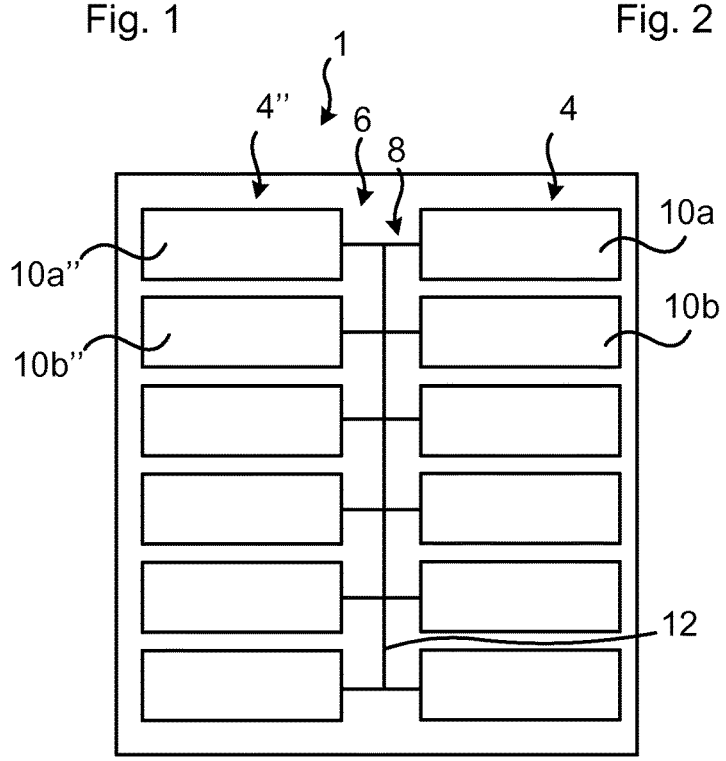
Fig. 3

ELECTRIC CONVERTER WITH COMPACT MODULE ARRANGEMENT FOR SUBSEA APPLICATIONS

FIELD OF THE INVENTION

The invention relates to an electric converter system for subsea applications, comprising a compact arrangement of electric components to facilitate handling and cooling of the electric converter system.

BACKGROUND OF THE INVENTION

Electric subsea installations and devices usually demand high standards regarding durability, long-term functionality and independence during operation. Another requirement is that stray inductance is kept very low in order to avoid overvoltage in the semiconductor switches and reduce the switching losses. Electric installations that need to be cooled during operation, such as subsea converters, require an autonomous and durable cooling of its components. It is known to use a dielectric liquid such as a for example oil as cooling fluid. In general electric subsea installations need to be pressurized by the dielectric fluid, thus said fluid, which is preferably a liquid, should be, at least almost, incompressible. The dielectric liquid is used as cooling medium and as electric insulation medium for insulating electrical components against each other and against a housing or tank.

Referring specifically to subsea converters there are some requirements that make the construction of a subsea converters quite difficult. Due to the high reliability that is usually required, and since it may be difficult to modify and provide access to personnel for maintenance for the subsea converter or for the electric installation from the outside, specialized personnel is normally hired. This is expensive and complicated and can lead to a long downtime of the electric converter. It is thus another requirement that the cooling system and the electric converter system is able to work autonomously and independent for a long period.

Cooling systems for electric equipment and specifically for electric subsea converters are used to cool down electric components, such as semiconductor modules, gate drives, control elements, connections and capacitors. These components generate heat that needs to be dissipated by the cooling system. The cooling system of subsea converters are usually designed in a simple manner avoiding any unnecessary parts and mechanisms. Generally it is desirable to have passive cooling systems, i.e., cooling systems without any driven or powered parts, such as for example pumps, to cool down the electric components. In some cases natural convection is used. Natural convection helps to avoid the use of a pump but it may have a low efficiency. Cooling by natural convection uses the heat exchange between the cooling liquid and the surrounding sea water to generate circulation within the cooling system and thus within the electric installation and the subsea converter, respectively. Usually some kind of a heat exchanger is used to transfer heat from the cooling liquid to the sea water.

In general, the outer sides of the housings of subsea converters, the heat exchangers, and any other parts that are in contact with the sea water should stay below a surface temperature of around 30° C. Thus even under full operating load the surfaces of the housing, the heat exchanger, and any other parts in contacts with the surroundings should be below said temperature value. If the temperature reaches values higher than around 30° C. sea life, such as algae, plankton, mussels, corals or the like, will grow on the outer side of the subsea converter and the heat exchanger respectively, which increases the thermal resistance of the housing and the heat exchanger of the subsea converter. As a result, sea life builds up on and clogs the outer surfaces of the subsea converter, thereby forming a thermal insulation layer that reduces the capability to dissipate heat from the affected surfaces. Since not all electric components of the subsea converter have the same heat flux that needs to be dissipated when in use, the sea life growth on the outer side of the subsea converter can be uneven which leads to different thermal insulation values on the surface of the subsea converter, making it even more difficult to predict and calculate the heat dissipation and to determine the optimal operating load of the electric converter.

Another problem that relates to the growth of sea life on the housing, specifically the growth of sea life on the heat exchanger, is the spacing of the fins of the heat exchanger. In order to avoid that the sea life completely blocks the circulation of sea water through the heat exchanger, the spacing between the fins that extend into the sea water, away from the subsea converter and its housing, needs to be chosen comparably large, thus reducing the efficiency of the heat exchanging process. In conventional electric modules the bus bar connections are quite long and sometimes cumbersome. However, it is an on-going requirement to keep the bus bar connections as short as possible since the material, such as copper, used for these connections is generally expensive, heavy and the longer the bus bar connections are the more electric losses appear, which is not desirable. Environmental laws or aspects may further require that the smallest amount of dielectric liquid is used, to avoid environmental damages in case of a failure.

DE 10 2011 006 988 A1 discloses a two-piece cell comprising a cooling body with an inlet and an outlet. The two-piece cell further comprises terminals X1 and X2.

EP 2 487 326 A1 discloses a subsea electronic system comprising pressure resistant enclosure with dielectric liquid and a heat generating electric component at least partially immersed in the dielectric liquid for cooling reasons.

In addition it is preferred that the electronic converter system satisfies multi-module and multilevel configurations, which allow an easy installation and removal of electric modules in order to provide a flexible and versatile electric converter system.

Hence there is a need to improve the design and configuration of an electric converter system, especially an electric subsea converter system, and also to improve the arrangement of electric components in electric converter systems.

SUMMARY OF THE INVENTION

One object of the present invention is to provide an improved electric converter system with a compact design and optimized arrangement of electric components and electric modules.

In view of the above it is a particular object of the present invention to provide an electric converter system that is compact, versatile and economic.

Disclosed herein is an electric converter system, comprising a housing configured to receive a dielectric fluid, at least two electric modules, each comprising a first space and a second space, the first space comprising a connecting portion. The converter system further comprises a cooling system configured to circulate the dielectric fluid to cool the electric modules, and an inter module bus bar portion comprising a complementary connecting portion. The connecting portion is configured to be connected to the complementary connecting portion of the inter module bus bar portion. The inter module bus bar portion is configured to interconnect one of the at least two electric modules with the other of the at least two electric modules, said one electric module being proximate to said other electric module. The connecting portion, the first space and the second space of each electric module are arranged in series.

An electric converter system comprising the above indicated features has the advantage of having a compact design and facilitates the use of an efficient and practical cooling system.

Another advantage concerns the reduced lengths of the bus bar connections and thus the reduced amount of material used due to the compact and modular design of the electric modules and due to the arrangement of the connecting portion, the first space and the second space. Shorter bus bar connections also lead to lower electric losses and improve the efficiency of the electric converter system.

An electric module with the above build-up has further the advantage that it can be easily stacked.

The configuration of having at least two electric modules further allows a high flexibility since the converter system is configured to receive a variable number of electric modules, said modules being configured to be stacked or aligned via plugs or similar electric connections, so that the number of electric modules can be easily adapted to application requirements.

The cooling system may be driven by natural convection. This avoids the use of a pump or other driven mechanism to circulate the fluid.

In an embodiment the first space may comprise a semiconductor element and a heat sink thermally connected to the semiconductor element. The second space may comprise a capacitor element. Advantageously the connecting portion is located on one side of the first space and the second space is located and on the opposite side of the first space.

The semiconductor element may be an insulated gate bipolar transistor (IGBT), but not necessarily.

The above design, build-up or configuration of the electric modules provides shortened intra module bus bar portions and reduces at the same time stray inductance. It is advantageous to position the first space next to the connecting portion to avoid unnecessary electric connection lines or intra module bus bar portions.

Advantageously the cooling system may be configured to generate a first dielectric fluid stream and a second dielectric fluid stream, said first and second fluid streams being configured to cool down the first and the second spaces, respectively, of the stacked or aligned at least two electric modules.

The fluid stream paths and the cooling system, respectively, are configured to be adapted to heat dissipation requirements of various electric components and thus the flow rates of the correspondent fluid streams may differ from one another.

The heat sinks of the at least two electric modules may be arranged so that the first dielectric fluid stream passes the heat sinks in series. The first and second dielectric fluid streams may be cooled down by an external heat exchanger, which may transfer heat energy from the dielectric fluid to the surrounding medium, such as for example sea water.

In an embodiment the heat sink may comprise heat sink fins, which may be oriented so that first dielectric fluid stream flows in a vertical direction upwards through spaces in between the heat sink fins, when the electric converter system is in use.

Such heat sink fins improve the efficiency of the cooling system. Further, the spaces in between the heat sink fins generate a first duct for the first dielectric fluid stream.

Advantageously at least two electric modules of a stack or a row of electric modules are arranged symmetrically, so that the connecting portions of the at least two electric modules are all on the same side of the stack or row.

Such a stack or row reduces the length of the inter module bus bar portions and facilitates thus the stacking of the modules and the modularity of the electric converter system.

Modular multilevel converters (MMC) may be particularly suitable for subsea use, since they are reliable. MMCs are configured to provide redundant power modules or power cells. It is possible to arrange the power modules in rows and columns (stacks). The cooling system may be adapted to the arrangement of MMC power modules. It is possible to adapt the cooling system to the modularity of the power cells, meaning that the cooling system as a whole is modular.

In case MMCs are used, the cell capacitors and the IGBTs need to be cooled, thus the first fluid stream may be used to cool the IGBTs and the second fluid stream may be used to cool the cell capacitors.

The invention, however, is not limited to MMCs; any other suitable electric module or cell, such as for example two-level converters, three-level converters or MMC variants, fall within the scope of the present invention.

In an embodiment the capacitor element comprises a plurality of capacitors arranged so that the second dielectric fluid stream flows in a vertical direction upwards through interspaces in between the capacitors. The capacitors may comprise a longitudinal direction, for example in case the capacitors are cylindrical capacitors, said longitudinal direction being oriented horizontally or at least more or less perpendicular to the second dielectric fluid stream.

The capacitors are arranged distant from one another, so that there is room in between them, in order to let dielectric fluid of the second dielectric fluid stream pass through to cool down the capacitors.

In one embodiment the capacitors comprise connection ports on one side and the capacitors are arranged so that the connection ports of the capacitors arranged in one row face the connection ports of the capacitors arranged in another row.

The rows of capacitors in a capacitor element are configured to be arranged back-to-back in order to reduce the length of intra module bus bar portions that interconnect the individual capacitors.

The electric converter system may comprise a number of stacks or rows of electric modules, whereby the stacks or rows are arranged so that the connecting portions of one stack or row are facing the connecting portions of an opposed or opposite stack or row.

In an advantageous embodiment the at least two electric modules are electrically insulated towards one another by dielectric fluid and wherein the stack or row of at least two electric modules are insulated by dielectric fluid towards the housing. Electric shocks and electric losses are thus reduced and ideally avoided.

The electric converter system may advantageously be configured for subsea use, thus sealed and pressurized.

It is further possible to provide an electronic converter system comprising a cooling system with an arbitrary number of dielectric fluid streams.

The dielectric fluid used may be oil or an ester based fluid.

As already indicated the electric converter system may comprise a plurality of electric modules forming vertical stacks. The first spaces and the second spaces may be arranged in series in respect to the first and second dielectric fluid stream.

It is possible to use a number of vertical stacks or rows. According to one embodiment in the range of 3 to 18 stacks are used.

Generally, all terms used in the claims are to be interpreted according to their ordinary meaning in the technical field, unless explicitly defined otherwise herein. All references to "a/an/the element, apparatus, component, means, step, etc." are to be interpreted openly as referring to at least one instance of the element, apparatus, component, means, step, etc., unless explicitly stated otherwise. The steps of any method disclosed herein do not have to be performed in the exact order disclosed, unless explicitly stated.

BRIEF DESCRIPTION OF THE DRAWINGS

The invention is now described, by way of example, with reference to the accompanying drawings, in which:

FIG. 1 shows a schematic view along arrow I-I of FIG. 2 on a cross section of a simplified embodiment of an electric converter system according to the invention;

FIG. 2 shows a schematic side view along arrow II-II of FIG. 1 on a cross section through the electric converter system according to FIG. 1;

FIG. 3 shows a schematic view on a cross section of another simplified embodiment of an electric converter system according the invention;

DETAILED DESCRIPTION OF THE INVENTION

The invention will now be described more fully hereinafter with reference to the accompanying drawings, in which certain embodiments of an electric converter system and electric modules are shown. This invention may, however, be embodied in many different forms of electric converter systems and should not be construed as limited to the embodiments set forth herein; rather, these embodiments are provided by way of example so that this disclosure will be thorough and complete, and will fully convey the scope of the invention to those skilled in the art. Like numbers refer to like elements throughout the description.

Figure 4:
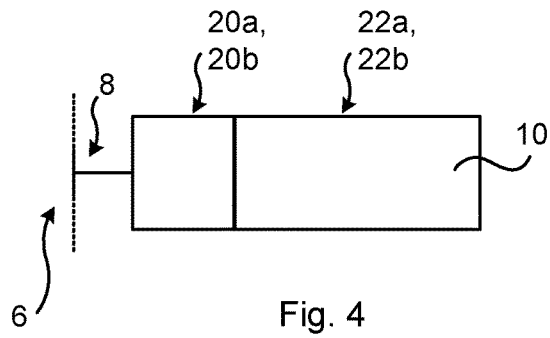
FIG. 4 shows a side view of a simplified electric module configured to be installed in an electric converter system according to the invention.
Figure 5:
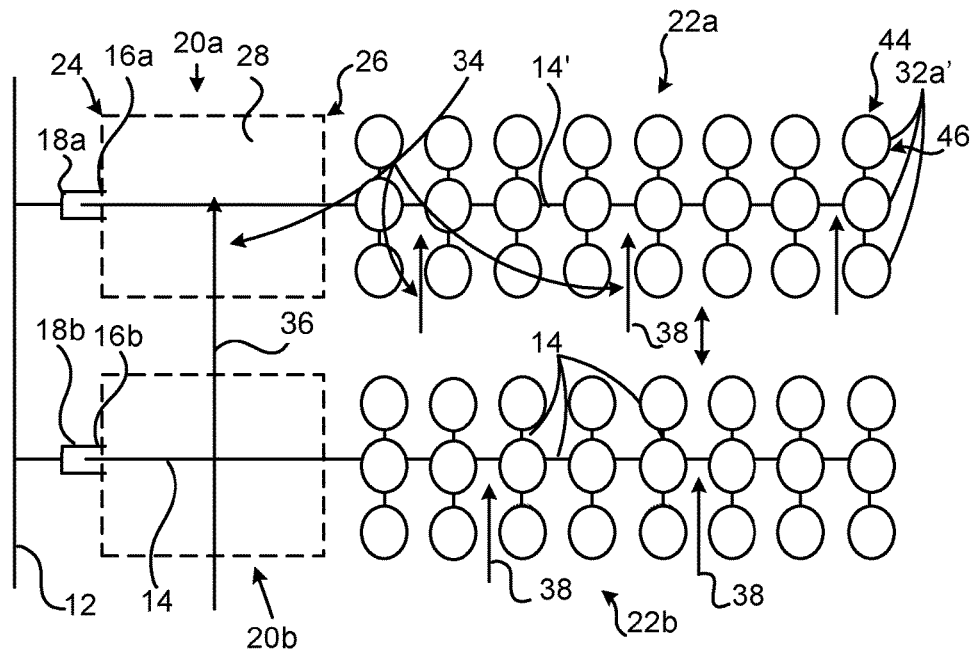
FIG. 5 shows a more detailed side view of a section of an electric converter system according to the invention comprising two electric modules.
Figure 6:
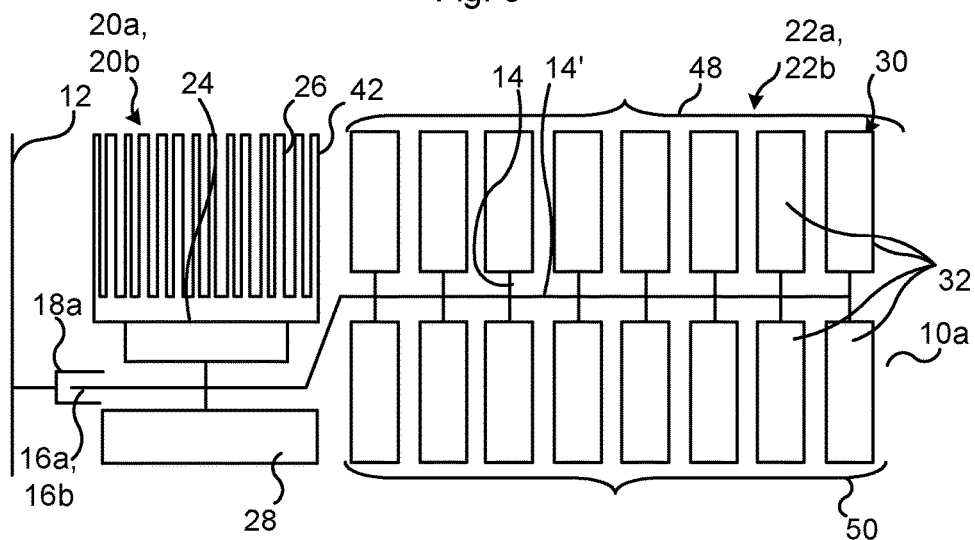
FIG. 6 shows a top view of the section shown in FIG. 5.

Referring now to FIGS. 1 to 8, which illustrate various embodiments of the present invention, an electric converter 1 comprising a housing 2, a stack 4, 4', 4" of at least two electric modules 10a, 10b a bus bar arrangement 6, a connecting mechanism 8 and a cooling system 34 is shown. The at least two electric modules 10a, 10b are arranged within the housing 2. The bus bar arrangement 6 comprises an inter module bus bar portion 12 and an intra module bus bar portion 14. The inter module bus bar portion 12 is configured to interconnect the electric modules 10a, 10b with one another. The intra module bus bar portion 14 is configured to interconnect the electric components, arranged in each of the electric modules 10a, 10b, with one another, as shown in FIGS. 5 and 6. The connecting mechanism 8 is used and configured to connect the electric modules 10a, 10b to the inter module bus bar portion 12. The connecting mechanism 8 comprises a connecting portion 16a, 16b arranged next to the first space 20a, 20b and a complementary connecting portion 18a, 18b arranged on the inter module bus bar portion 12.

The housing 2 is configured to receive a dielectric fluid, which is used by the cooling system 34 to dissipate the heat energy generated by the electric components. The housing 2 may be a tank configured to be pressurized and sealed.

The embodiments illustrated in FIGS. 1 to 3 comprise a number of stacks 4, 4', 4" and a plurality of electric modules 10a, 10a' 10b, 10b' per stack. The number of stacks 4, 4', 4" and the amount, or number, of electric modules 10a, 10b can vary and may be chosen based on specific application requirements. The electric converter system 1 illustrated in FIGS. 1 to 8 is configured as a multilevel modular converter system meaning that the number of stacks 4, 4', 4" and the number of electric modules 10a, 10b may be changed or adapted to requirements depending on the specific application. The use of various numbers of electric modules 10a, 10b and various numbers of stacks 4, 4', 4" is thus within the scope of the present invention. Further, the electric modules 10a, 10b may be arranged in vertical stacks 4, 4', 4" as illustrated in the figures or they may be arranged in horizontal rows (not shown).

Each of the electric modules 10a, 10b is stackable and comprises a first space 20a, 20b and a second space 22a, 22b. The first and second space may be arranged next to one another. It is however possible to arrange the first and second space 20a, 20b, 22a, 22b not immediately next to one another. The electric modules 10a, 10b are arranged proximate to one another. The at least two electric modules 10a, 10b may be arranged adjacent to one another with an insulation gap in-between. Proximate means that between the at least two electric modules 10a, 10b only dielectric fluid is arranged and no other electrical component. The distance between at least two electric modules 10a, 10b may be about 0.5 cm to 25 cm. The connecting portion 16 is arranged adjacent to the first space 20a, 20b. The connecting portion 16, the first space 20a, 20b and the second space 22a, 22b are arranged in series along a line which generally is straight and which generally corresponds to a longitudinal direction of the electric modules 10a, 10b. Said line may be oriented horizontally but it may also be oriented vertically or in any other direction. The connecting portion 16 is arranged on one side of the first space 20a, 20b. The second space 22a, 22b is arranged on the opposite side of said one side.

When the electric modules 10a, 10b are arranged in vertical stacks 4, 4', 4" or rows, the connecting portions 16a, 16b of each electric module 10a, 10b of a vertical stack or horizontal row are arranged on a generally straight line on one side of the vertical stack or row, as illustrated in FIGS. 1 to 3 and 5. In the case more than one vertical stacks 4, 4', 4" or rows are arranged in a housing 2, the connecting portions 16a, 16b of one vertical stack 4 are arranged such that they face the connecting portions 16a, 16b of the other vertical stack 4", as illustrated, for example, in FIG. 3. Such an arrangement may be called a stack pair. Rows may be arranged in a similar manner, thus forming row pairs. The connecting portions 16a, 16b of each vertical stack 4, 4', 4" are then interconnected via the inter module bus bar portion 12. An arbitrary number of vertical stacks 4, 4" or vertical stack pairs comprising a number of electric modules 10a, 10b, as illustrated in FIG. 3, may be arranged within the housing 2.

Figure 8:
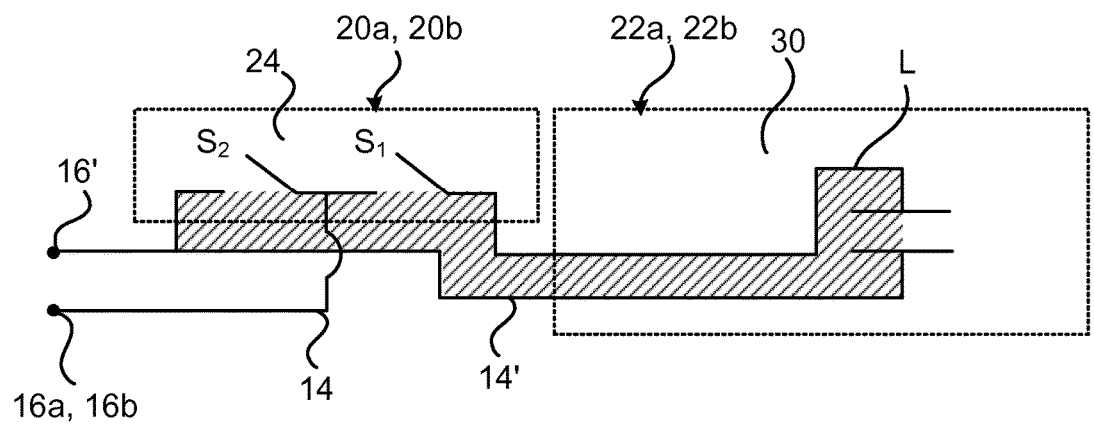
FIG. 8 illustrates the electric circuit and stray inductance generated by an electric module according to FIGS. 5 and 6.

The first and second spaces 20a, 20b, 22a, 22b are, for example, illustrated in FIGS. 4 and 8. Each of the first and second space 20a, 20b, 22a, 22b may comprise various electric components such as valves, switches, capacitors etc. In the illustrated embodiments the first space 20a, 20b comprises a semiconductor element 24, a heat sink or heat exchanger 26, which is thermally connected with the semiconductor element 24, and a gate drive and/or control element 28, as best illustrated in FIGS. 5 and 6. Referring still to FIGS. 5 and 6, the second space 22a, 22b comprises a capacitor element 30 comprising a plurality of capacitors 32.

The gate drive and/or control element 28 are/is used and configured to control the semiconductor element 24.

The heat sink 26, or heat exchanger, comprises heat sink fins 42, as for example illustrated in FIG. 6. The heat sink fins 42 are configured to delimit interspaces in between the fins 42. The interspaces delimited by the heat sink fins 42 of the electric modules 10a, 10b of one stack 4, 4', 4" or row are configured to form a first fluid duct and to receive, at least partly, a first dielectric fluid stream 36 of the cooling system 34, said first fluid stream 36 flowing upwards past the semiconductor element 24 and gate drive and/or control element 28 thus cooling the first space 20a, 20b and the semiconductor element 24, respectively.

In the embodiments illustrated in FIGS. 5 and 6, the heat sink 26 is configured to take up approximately 60% of the volume of the first space 20a, 20b. The heat sink 26 is arranged to be thermally connected to the semiconductor element 24. The semiconductor element 24 is electrically connected, via an intra module bus bar portion 14, to the gate drive and/or control element 28. Preferably the heat sink 26 and the semiconductor element 24 are arranged on one side of the bus bar portion 14 leading to the capacitor element 30 and the connecting portion 16a, 16b, respectively, and the gate drive and/or control element 28 are/is arranged on the opposite side.

The capacitors 32 of the capacitor element 30 are arranged next to the semiconductor element 24 and the capacitors 32 are interconnected by the intra module bus bar portions 14. The intra module bus bar portion 14 is also configured to interconnect the connecting portion 16a, 16b with the semiconductor element 24 and the capacitor element 30 of the second space 22a, 22b. The gate drive is connected to the (gate of the) IGBT module. The bus bar is connected to the collector and emitter of the IGBT module only. The power terminals of the IGBT module are thereby connected to the bus bar, whereas the control terminals/auxiliary terminals of the IGBT module are connected to the gate drive. The control electronics are connected to the gate drive.

The capacitors are arranged in series and/or parallel within the capacitor element 30 in order to provide a required output voltage and/or capacitance rating, respectively, as for example illustrated in FIGS. 5 and 6.

The capacitors 32 are configured to have a longitudinal shape, such as cylindrical as illustrated in FIGS. 5 and 6, or any other shape. The longitudinal direction of the capacitors 32 may be oriented horizontally or vertically or in any other direction, but preferably perpendicularly to a flow direction of the second fluid stream 38 of the cooling system 34, as for example illustrated in FIG. 5. Such an orientation allows the second dielectric fluid stream 38 to flow through the interspaces in-between the capacitors 32 and thus improves the cooling efficiency of the second dielectric fluid stream 38. The capacitors 32 are arranged distant from one another so that the fluid stream 38 may thus flow through interspaces in between the capacitors 32 to cool them down during use of the electric converter system 1. The capacitors 32 may be arranged in rows 46 and columns 44. Capacitors 32a' in one column may be interconnected by an intra module bus bar portion 14, which is then connected to an intra module bus bar portion 14' leading to the semiconductor element 24. A number of rows 46 and columns 44 of capacitors 32, in the illustrated case (as in FIG. 5) 3 by 8, thus twenty four capacitors 32 may form a first capacitor element portion 48. Another twenty four capacitors 32 may form a second capacitor element portion 50.

The connection ports, where the capacitors 32 of the first and second capacitor element portions 48, 50, respectively, are connected to the intra module bus bar portion 14, are all arranged on the same side so that the connection ports of the first capacitor element portion 48 are facing, or arranged opposite, the connection ports of the second capacitor element portion 50, as for example illustrated in FIG. 6. Such an arrangement shortens the lengths of the intra module bus bar portion 14. It is within the scope of the invention that the first and the second capacitor element portions 48, 50 may comprise any other arrangement and number of columns 44 and rows 46 of capacitors 32. Thus any other parallel or series connection arrangement of the capacitors 32 in the capacitor element 30 falls within the scope of the present invention. The first and second capacitor elements 48, 50 of the capacitor element 30 of the second space 22a, 22b may be configured and shaped so that they fit with the first space 20a, 20b, avoiding a gap or geometrical interruption in between the first and second space 20a, 20b, 22a, 22b. The cross sections cut in a direction perpendicular to the longitudinal direction of the electric module 10a, 10b of the first space 20a, 20b and the second space 22a, 22b may generally be congruent with one another.

The second space 22a, 22b is more voluminous than the first space 20a, 20b. The capacitor element 30 takes up more space than the semiconductor element 24. In the illustrated embodiments, the first space 20a, 20b takes up about 15% to 40% of the volume of the electric modules 10a, 10b.

The cooling system 34 may further comprise an external heat exchanger (not shown) configured to cool the fluid of the first and second fluid stream 36, 38. The external heat exchanger may be in thermal contact with the sea water. The cooling system 34 is further configured, so that it can be adapted to various heat energy dissipation requirements. The semiconductor element 24 generates a higher heat flux than the capacitor element 30, thus the first fluid stream 36 has, most likely, a higher flow speed and a higher flow rate than the second fluid stream 38. On the other hand the second fluid stream 38 may comprise greater volume of fluid than the first stream, since the capacitor elements 30 of the electric modules 10a, 10b of a stack 4, 4', 4" take up more volume than the semiconductor element 24.

The cooling system 34 may comprise additional fluid streams configured to cool down various electrical components, such as for example the intra- and inter module bus bar portions 12, 14 and/or the connecting mechanism 8.

The cooling system 34 may be driven by natural convection.

The connecting portion 16a, 16b and the complementary connecting portion 18a, 18b may be configured as simple plug mechanism, as for example known from electricity plugs, in order to easily mount the electric modules 10a, 10b.

The dielectric fluid is used to electrically insulate the electric modules 10a, 10b from one another and to electrically insulate the electric modules 10a, 10b from the housing 2/tank.

Figure 7:
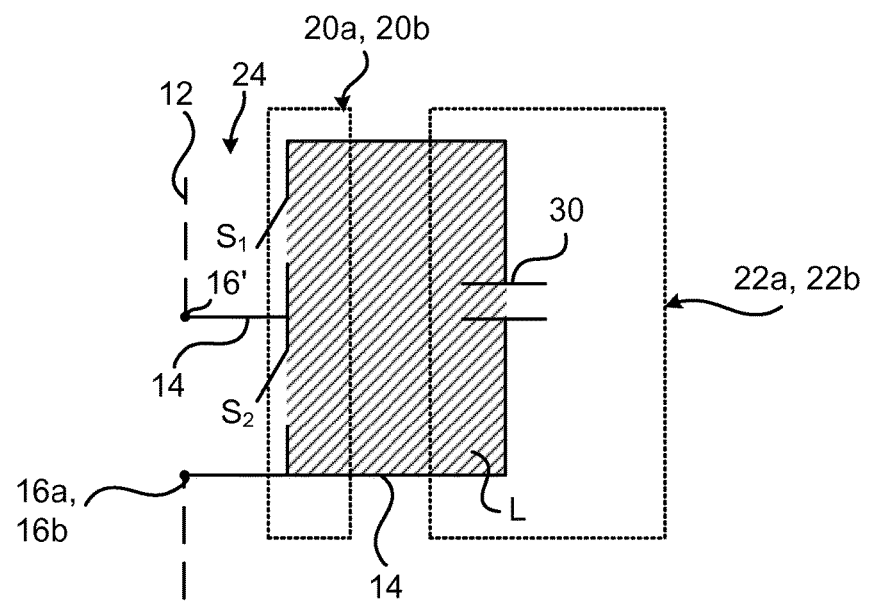
FIG. 7 illustrates the electric circuit and the stray inductance generated by a Modular Multi Level Converter (MMC)

FIGS. 7 and 8 relate to the electrical phenomenon of stray electrical inductance. FIG. 7 illustrates an electric diagram of a loop of an MMC electric module. S1 and S2 are semiconductor switches that may be connected in order to establish electric connections between the capacitor element 30, which may be a cell capacitor, and the connecting portion 16a, 16b, 16'. The hatched area illustrates schematically the area encompassed by the current in the intra module bus bar portion 14 causing stray inductance L. The stray inductance L should be kept as low as possible to minimize overvoltage in the switches S1 and S2, and to keep the switching losses low. In the embodiment shown in FIG. 7, the semiconductor switches S1 and S2 are generally arranged on a vertical line, one after the other, and the capacitor element 30 is arranged next to the semiconductor switches on the opposite side of the connecting portion 16a, 16b, 16'.

The electrical diagram illustrated in FIG. 7 relates to an arrangement, where the connecting portion 16a, 16b, 16', the first space 20a, 20b and the second space 22a, 22b are arranged in series. The arrangement has however, quite an extensive electric loop, so that a relatively high stray inductance (hatched area) is generated.

FIG. 8 schematically illustrates the stray inductance L of an electric module 10a, 10b as shown in FIGS. 5 and 6. It can be seen from FIG. 8 that the comparably slim and slender loop arrangement of FIGS. 5 and 6 results in a small stray inductance L, as illustrated in FIG. 8. The stray inductance L is small and thus the influence of the stray inductance L on electrical components, especially on the semiconductor switches S1, S2, is even more reduced than in the electric circuit illustrated in FIG. 7. It is to be noted that the capacitor element 30 is arranged distant from the connecting portion 16a, 16b, 16', which can be connected to the inter module bus bar portion 12 leading to the adjacent electric modules 10b. In the embodiment of FIG. 8 the switches S1, S2 are generally arranged on a horizontal line, one after the other. The connecting portions 16a, 16b, 16' may be configured to be electrically connected to a plug or the like.

The inventive concept has mainly been described above with reference to a few embodiments. However, as is readily appreciated by a person skilled in the art, other embodiments than the ones disclosed above are equally possible within the scope of the inventive concept, as defined by the appended patent claims. For example, the semiconductor element 24 may be an IGBT module and the electric modules 10a, 10b may be MMC cells. The invention is however not limited to such a specific configuration. For example, other semiconductor elements 24 such as a metal oxide semiconductor field effect transistor (MOSFET) fall within the scope of the invention. Further, although FIGS. 1 to 3 illustrate possible arrangements of electric modules 10a, 10b, the arrangement shown in these figures is not limited to specific build ups of electric modules 10a, 10b disclosed herein; any other suitable electric modules 10a, 10b may be stacked as shown in FIGS. 1 to 3.

The invention claimed is:

1. An electric converter system, comprising
a housing for receiving a dielectric fluid;
at least two electric modules arranged within the housing, each of the at least two electric modules comprising a first space and a second space, the first space comprising a connecting portion, a semiconductor element and a heat sink thermally connected to the semiconductor element;
the second space comprising a capacitor element;
a cooling system for circulating the dielectric fluid to cool the electric modules; and
an inter module bus bar portion comprising a complementary connecting portion;
wherein the connecting portion is for being electrically connected to the complementary connecting portion of the inter module bus bar portion, wherein the inter module bus bar portion is for electrically interconnecting one of the at least two electric modules with another of the at least two electric modules via the connecting portions such that the respective first spaces of the at least two electric modules are electrically interconnected to each other, said one electric module being proximate to said another electric module;
wherein the connecting portion, the first space and the second space of each electric module are arranged in series; and
wherein the connecting portion is located on one side of the first space and wherein the second space is located on the opposite side of the first space.

2. The electric converter system according to claim 1, wherein each of the at least two electric modules comprises an intra module bus bar portion configured to interconnect the capacitor element with the semiconductor element and the connecting portion.

3. The electric converter system according to claim 1, wherein the cooling system is configured to generate first respective dielectric fluid streams being configured to cool down the first and the second spaces, respectively, of the stacked or aligned electric modules.

4. The electric converter system according to claim 1, wherein the at least two electric modules of a stack or a row of electric modules are arranged symmetrically, so that the connecting portions of the at least two electric modules are all on the same side of the stack or row.

5. The electric converter system according to claim 1, wherein the electric modules form at least two stacks or rows of electric modules, wherein the at least two stacks or rows are arranged so that the connecting portions of one stack or row are facing the connecting portions of another stack or row.

6. The electric converter system according to claim 1, the electric converter system being configured as a modular multilevel electric converter.

7. An electric converter system, comprising
a housing for receiving a dielectric fluid;
at least two electric modules arranged within the housing, each of the at least two electric modules comprising a first space and a second space, the first space comprising a connecting portion, a semiconductor element and a heat sink thermally connected to the semiconductor element;
the second space comprising a capacitor element;
a cooling system for circulating the dielectric fluid to cool the electric modules; and
an inter module bus bar portion comprising a complementary connecting portion;
wherein the connecting portion is for being electrically connected to the complementary connecting portion of the inter module bus bar portion, wherein the inter module bus bar portion is for electrically interconnecting one of the at least two electric modules with another of the at least two electric modules, said one electric module being proximate to said another electric module;

wherein the connecting portion, the first space and the second space of each electric module are arranged in series;

wherein the cooling system is configured to generate first respective dielectric fluid streams being configured to cool down the first and the second spaces, respectively, of the stacked or aligned electric modules; and wherein the at least two electric modules are arranged in a stack and wherein the heat sink comprises heat sink fins oriented so that the first dielectric fluid streams flow in a vertical direction upwards through interspaces in between the heat sink fins, when the electric converter system is in use.

8. An electric converter system, comprising
a housing for receiving a dielectric fluid;
at least two electric modules arranged within the housing, each of the at least two electric modules comprising a first space and a second space, the first space comprising a connecting portion, a semiconductor element and a heat sink thermally connected to the semiconductor element;
the second space comprising a capacitor element;
a cooling system for circulating the dielectric fluid to cool the electric modules; and
an inter module bus bar portion comprising a complementary connecting portion;
wherein the connecting portion is for being electrically connected to the complementary connecting portion of the inter module bus bar portion, wherein the inter module bus bar portion is for electrically interconnecting one of the at least two electric modules with another of the at least two electric modules, said one electric module being proximate to said another electric module;

wherein the connecting portion, the first space and the second space of each electric module are arranged in series; and wherein the capacitor element comprises a plurality of capacitors arranged so that a dielectric fluid stream flows in a vertical direction upwards through interspaces in between the capacitors.

9. The electric converter system according to claim 8, wherein each of the capacitors comprises a longitudinal direction, which is oriented, at least approximately, horizontally.

10. The electric converter system according to claim 8, wherein the capacitors are cylindrically shaped.

11. The electric converter system according to claim 8, wherein the capacitors comprise connection ports on one side and wherein the capacitors are arranged so that the connection ports of capacitors arranged in one row face the connection ports of the capacitors arranged in another row.

12. The electric converter system according to claim 1, wherein the at least two electric modules are electrically isolated towards one another by dielectric fluid and wherein the stack or row of at least two electric modules are isolated by dielectric fluid towards the housing.

13. The electric converter system according to claim 1, wherein the converter system is configured for subsea use.

* * * * *